United States Patent [19]

Davis et al.

[11] Patent Number: 4,656,366

[45] Date of Patent: Apr. 7, 1987

[54] CONTROL CIRCUITRY USING TWO BRANCH CIRCUITS FOR HIGH VOLTAGE SOLID-STATE SWITCHES

[75] Inventors: James A. Davis, Glen Ellyn; William F. MacPherson, Winfield Township, DuPage County; Harry E. Mussman, Glen Ellyn, all of Ill.; Peter W. Shackle, Bridgewater, N.J.

[73] Assignee: American Telephone and Telegraph Company AT&T Bell Laboratories, Murray Hill, N.J.

[21] Appl. No.: 351,911

[22] Filed: Feb. 24, 1982

Related U.S. Application Data

[63] Continuation of Ser. No. 107,777, Dec. 28, 1979, abandoned.

[51] Int. Cl.⁴ ............................................. H03K 17/60
[52] U.S. Cl. ................................ 307/252 A; 307/305; 307/311; 357/22; 357/38; 357/58
[58] Field of Search ................................ 357/22, 38, 58; 307/252 A, 252 C, 252 J, 252 K, 305, 311

[56] References Cited

U.S. PATENT DOCUMENTS

| | | | |
|---|---|---|---|
| 3,289,277 | 11/1966 | Miller | 307/271 |
| 3,737,721 | 6/1973 | Ogawa | 307/252 A |
| 3,821,565 | 6/1974 | Horinaga | 307/252 C |
| 4,060,821 | 11/1977 | Houston et al. | 357/38 |
| 4,117,351 | 9/1978 | Kalfus et al. | 307/252 C |
| 4,217,504 | 8/1980 | Fullmann et al. | 307/252 C |
| 4,242,697 | 12/1980 | Berthold et al. | 357/38 |

OTHER PUBLICATIONS

D. E. Houston et al., "A Field Terminated Diode," *IEEE Transactions on Electron Devices*, vol. ED-23, No. 8, Aug. 1976, pp. 905-911.

*Primary Examiner*—Joseph E. Clawson, Jr.
*Attorney, Agent, or Firm*—David I. Caplan

[57] ABSTRACT

To switch a first gated diode switch (GDSL1) to the "OFF" state requires a voltage applied to the gate which is more positive than that of the anode or cathode and a sourcing of current into the gate of substantially the same order of magnitude as flows between the anode and cathode of the first switch. Control circuitry, which uses a second gated diode switch (GDSC) coupled by the cathode to the gate of the first switch (GDSL1), is used to control the state of the first switch (GDSL1). The control circuitry also comprises a first branch circuit coupled to the anode of the GDSC and to a first potential source V1 and a second branch circuit coupled to the anode of GDSC and to a second potential source V2 which is of a lower potential than V1. The second branch circuit has a high voltage and high current capability switch in series between V2 and the anode of GDSC. The first branch circuit has a high voltage but modest current handling switch in series between V1 and the anode of GDSC. The second branch circuit is used to provide a surge of current if and when needed during the current break operation to turn GDSL1 to an OFF state and the first branch circuit is used to maintain the state of the load switch. The second branch circuit can be shared by many control circuits.

7 Claims, 4 Drawing Figures

CONTROL CIRCUITRY USING TWO BRANCH CIRCUITS FOR HIGH VOLTAGE SOLID-STATE SWITCHES

CROSS-REFERENCE TO RELATED APPLICATIONS

This application is a continuation of our application Serial No. 107,777 filed Dec. 28, 1979, now abandoned.

TECHNICAL FIELD

This invention relates to control circuitry for controlling the state of solid-state switches and, in particular, to control circuitry for controlling the state of solid-state switches which have high voltage and relatively high current capabilities.

BACKGROUND OF THE INVENTION

High voltage and relatively high current capability solid-state switches, such as one described in an article entitled "A Field Terminated Diode" by Douglas E. Houston et al, published in *IEEE Transactions on Electron Devices*, Vol. ED-23, No. 8, August, 1976, and those discussed in pending U. S. patent applications Ser. Nos. 972,056 now abandoned. (A. R. Hartman-T. J. Riley-P. W. Shackle, 972,021 now abandoned (A. R. Hartman-A. U. Mac Rae-P. W. Shackle, 972,022 now abandoned (J. E. Berthold-A. R. Hartman-T. J. Riley-P. W. Shackle), and 971,886 now abandoned. (A. R. Hartman-B. T. Murphy-T. J. Riley-P. W. Shackle), all filed Dec. 20, 1978, and having a common assignee with the present application and U. S. patent applications Ser. Nos. 107,774, now abandoned. (A. R. Hartman-T. J. Riley-P. W. Shackle), 107,773, now abandoned.

(A. R. Hartman-B. T. Murphy-T. J. Riley-P. W. Shackle), 107,772, now abandoned. (A. R. Hartman-A. U. Mac Rae-P. W. Shackle Case), 107,780, now abandoned (J. E. Berthold-A. R. Hartman-T. J. Riley-P. W. Shackle), and 107,775, now abandoned (A. R. Hartman-T. J. Riley-P. W. Shackle), which are all being filed concurrently with the present application and have a common assignee with the present application, have an CN (conducting) state and an OFF (blocking) state. These switches are capable of blocking relatively large potential differences in the OFF state. Each of these switches has two output terminals which are generally denoted as the anode and cathode, a control terminal which is generally denoted as the gate, and a semiconductor body whose bulk separates the anode, cathode, and gate regions. The parameters of the various portions of the semiconductor are such that with the potential of the anode region being greater than that of the cathode region and the potential of the gate region being insufficient to cause the potential of a vertical cross-sectional portion of the bulk of the semiconductor body between the anode and cathode to be greater in potential than the anode or cathode regions there is facilitated a substantial current flow between the anode and cathode regions via the bulk. With the potential of the gate region being sufficiently more positive than that of the anode and cathode regions to cause a vertical cross-sectional portion of the bulk of the semiconductor body between the anode and the cathode regions to be more positive in potential than the anode and cathode regions there is facilitated an interrupting or inhibiting of current flow between the anode and cathode regions. The magnitude of the needed gate potential necessary to turn off these switches is a function of the geometry and doping levels of the semiconductor regions of each switch and of the anode and cathode potentials.

Control circuitry used to apply a blocking voltage to the gate terminal of each of these switches must be able to sustain a more positive voltage than is at the anode and cathode terminals and must be able to supply current which is generally of the same magnitude as flows through the anode and cathode of each switch.

Pending U. S. patent applications Ser. Nos. 972,023 now abandoned, and 972,024, which were both filed Dec. 20, 1978, and have a common assignee with the present application, describe and illustrate control circuitry which itself uses a high voltage and current switch of the type described hereinabove to control the state of a similar switch. If a control circuit should fail to break (interrupt) current flow through an ON switch connected thereto, it is necessary to electrically disconnect the control circuitry from one of the supply potential sources. The control circuitry is then reset and then reconnected to the potential source. It is then activated again so as to break conduction through the ON switch.

Usually a conventional high voltage and high current capability switch is used between the high voltage source and the control circuitry. This switch can be an optically activated switch. Generally it is a relatively expensive component and only one is used for a relatively large number of control circuits. If any of the switches to be controlled fails to turn off, it is necessary to disconnect all the control circuits from the power supply. This may result in all of the switches connected to the control circuitries being switched to the ON state independent of which state is desired. This is undesirable in some switching applications. The speed of operation and power dissipation of the above-described control circuitry may be slower and higher, respectively, than is desired in some switching applications.

It is desirable to have circuitry capable of controlling high voltage and high current solid-state switches of the type discussed hereinabove which has improved switching time and lower power dissipation than prior art circuitry, and which can maintain some switches connected thereto in the desired state even if one of the switches being controlled fails to break current (assume the OFF state). Copending U. S. patent application Ser. No. 107,778, now Pat. No. 4,250,409 (J. A. Davis-W. F. MacPherson-P. W. Shackle) which is being filed concurrently with the present application and in which there is a common assignee with the present application, contains similar subject matter with the present application.

SUMMARY OF THE INVENTION

The present invention is directed to control circuitry for controlling the state of high voltage and relatively high current solid state switches of the type described herein above. The control circuitry essentially comprises a control switch (GDSC), which in a preferred embodiment is a gated diode switch, a first branch circuit coupled to the anode of GDSC and to a first potential source (V1), and a second branch circuit coupled to the anode GDSC and to a second potential source (V2) which in a preferred embodiment has a lower potential than (V1). The control switch (GDSC) is coupled by an output terminal (typically the cathode) to the gate terminal of a load switch (GDSL1) whose state is to be controlled. The second branch circuit comprises a high voltage and high current capability switch that is coupled in series between V2 and the anode of GDSC. This switch is typically the series combination of two photo-Darlington circuits. The first branch circuit comprises a high voltage but modest current capability switch in series between V1 and the anode of GDSC. This switch is typically a p-n-p transistor.

The first circuit branch maintains the load switch (GDSL1) in an ON state such that conduction can occur through the load switch (GDSL1) if the potentials of the anode and cathode thereof are sufficient to support conduction or it can inhibit conduction by maintaining the load switch (GDSL1) in an OFF state. The second branch circuit serves to help interrupt conduction through the load switch (GDSL1) independent of the potentials applied to the anode and cathode terminals thereof so long as these applied potentials are within preselected limits. Thus the second branch circuit helps switch the load switch (GDSL1) to an OFF state. The second circuit branch can be common to a great number of control circuitries which each have a separate first control branch and control switch (GDSC). One advantage of this control circuit is that if one load switch (GDSL) fails to assume to the OFF "state" and the switch of the second branch circuit is opened, most other load switches (GDSLs) are maintained in the preselected states by the first branch circuits. In addition, the sharing of the second branch circuit reduces costs.

These and other features and advantages of the invention are better understood from a consideration of the following detailed description taken in conjunction with the accompanying drawing.

DETAILED DESCRIPTION

Figure 1:
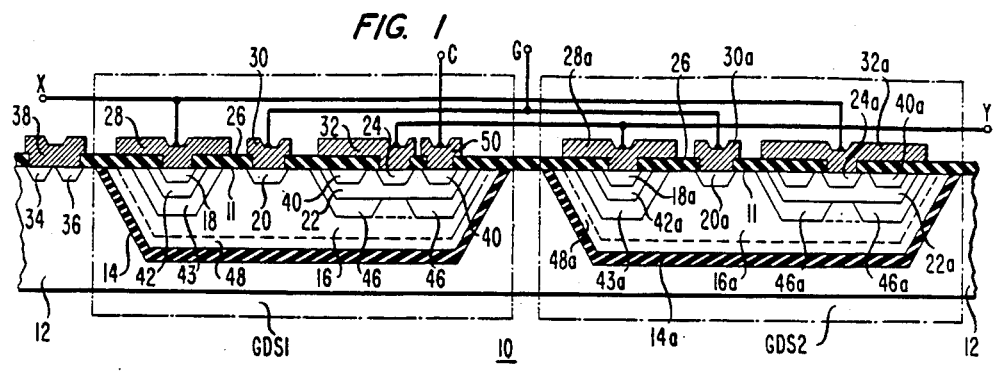
FIG. 1 illustrates a solid-state bidirectional switch.

Referring now to FIG. 1, there is illustrated a semiconductor structure 10 comprising two gated diode switches, GDS1 and GDS2, which are illustrated within dashed line rectangles and are both formed on a common support member 12. Structure 10 is disclosed and described in a copending U. S. patent application Ser. No. 107,776, now U.S. Pat. No. 4,309,715, (W. F. MacPherson-R. S. Scott-P. W. Shackle), which is being filed concurrently with this application and in which there is a common assignee. GDS2 is disclosed and described in copending U. S. patent application Ser. No. 107,774, now abandoned (A. R. Hartman-T. J.Riley-P. W. Shackle), which has a common assignee and is being filed concurrently with this application. Support member 12 is typically a semiconductor wafer or a substrate. Dielectric layers 14 and 14a separate monocrystalline semiconductor bodies 16 and 16a, respectively, from support member 12 and from each other. Support member 12 has a major surface 11 and bodies 16 and 16a each have a portion that is common with surface 11. Whereas only two gated diode switches are illustrated, a plurality of dielectrically isolated gated diode switches of the type of GDS1 and/or GDS2 can be formed in a common semiconductor wafer or substrate 12.

GDS1 and GDS2 are illustrated having electrical connections therebetween which facilitate the use thereof as a bidirectional high voltage switch. GDS1 and GDS2 need not be electrically connected and each can function independently of the other.

In one typical embodiment, support member 12 is a semiconductor wafer (substrate) of n or p type conductivity and semiconductor bodies 16 and 16a have bulk portions thereof which are of p− type conductivity. The semiconductor regions contained within semiconductor body 16 are very similar to those contained in body 16a. A localized anode region 18, which is typically of p+ type conductivity, is included in body 16 and has a portion thereof that extends to surface 11. Surrounding anode region 18 is a p type region 42 which also has a portion thereof which extends to surface 11. Surrounding region 42 is a p− type region 43 which also has a portion thereof which extends to surface 11. The conductivity of region 42 is intermediate between that of anode region 18 and semiconductor body 16. The conductivity of region 43 is intermediate between that of region 42 and semiconductor body 16. Electrode 28 is illustrated making contact to region 18. Electrode 28 is separated from portions of surface 11 other than those over the exposed portion of region 18 by dielectric layer 26. A localized gate region 20 of n+ type conductivity is included in body 16 and has a portion thereof which extends to surface 11 and is separated from region 42 by portions of the bulk of semiconductor body 16. An electrode 30 contacts region 20 at surface 11. Electrode 30 is separated from portions of surface 11 other than those over the exposed portion of region 20 by dielectric layer 26. A localized cathode region 24, which is of n+ type conductivity, is included in body 16 and is separated from region 20 by portions of the bulk of semiconductor body 16. Region 24 is surrounded by a p+ type guard ring 40 which, in turn, is surrounded by a p type region 22 which, in turn, is surrounded by a guard ring like p type region 46. Region 46 can extend, as is illustrated by the dashed line, to essentially completely surround region 22, except for the portions thereof common to surface 11. Region 46 is separated from regions 20 and 43 by portions of the bulk of semiconductor body 16. Electrode 32 contacts regions 24 and a separate electrode 50 contacts region 40. Both electrodes are separated from portions of surface 11 other than over the respective exposed portions of regions 24 and 40. A layer 48 of n type conductivity exists between the dielectric layer 14 and semiconductor body 16. Layer 48, which is part of a preferred embodiment, is shown in dashed line since it is optional. Gate region 20 also serves as the collector of a lateral n-p-n transistor with cathode region 24 serving as the emitter and regions 46, 22, and 40 serving as the base.

Semiconductor body 16a contains regions which are very similar to those contained within semiconductor body 16 with the exception of the fact that the p+ type guard ring region 40a does not have a separate electrical contact thereto as does guard ring 40.

GDS1 is typically operated as a switch which is characterized by a low impedance between anode region 18 and cathode region 24 when in the ON (conducting) state and as a high impedance between said two regions when in the OFF (nonconducting) state. With operating potentials applied to anode region 18 and cathode region 24, the potential applied to gate region 20 determines the state of the switch. Conduction between anode region 18 and cathode region 24 can occur if the potential of the gate region 20 is near or below the potential of the anode region 18, cathode region 24, and region 22. During the ON state holes are injected into body 16 from anode region 18 and electrons are injected into body 16 from cathode region 24. This effectively lowers the resistance of body 16 such that the resistance between anode region 18 and cathode region 24 is relatively low when GDS1 is operating in the ON state. This type of operation is denoted as dual carrier injection and the type of structure described therein has been denoted as a gated diode switch (GDS). Guard ring region 40 and regions 22 and 46 help limit the punch-through of a depletion layer formed during operation between gate region 20 and cathode region 24 and help to inhibit the formation of a surface inversion layer between these two regions. In addition, they facilitate gate region 20 and cathode region 24, being relatively closely spaced apart. This facilitates relatively low resistance between anode region 18 and cathode region 22 during the ON state.

Substrate 12 is typically held at the most positive potential level available. Conduction between anode region 18 and cathode region 24 is inhibited or cut off if the potential of gate region 20 is sufficiently more positive than that of anode region 18 and cathode region 24. The amount of excess positive potential needed to inhibit or cut off conduction is a function of the geometry and impurity concentration (doping) levels of GDS1. This positive gate potential causes a portion of body 16 between gate region 20 and the portion of dielectric layer 14 therebelow to be at a potential that is more positive than that of anode region 18, cathode region 24, and region 22. This positive potential barrier inhibits the conduction of holes from anode region 18 to cathode region 24. It essentially pinches off body 16 against dielectric layer 14 in the bulk portion of semiconductor body 16 below gate region 20 and extending down to dielectric layer 14. It also serves to collect electrons emitted at cathode region 24 before they can reach anode region 18. Examples of control circuitry capable of supplying the needed gate potentials and absorbing the electrons are illustrated and described in copending U.S. patent applications Ser. Nos. 972,023 and 972,024, which were both filed on Dec. 20, 1978, and have a common assignee with the present application. Other control circuitry in accordance with the present invention for controlling gated diode switches like GDS1 and/or GDS2 is illustrated and described in FIGS. 3 and 4 herein.

The ON state can be achieved by allowing gate electrode 30 to electrically float in potential, forward-biasing the anode region 18 with respect to the cathode region 24, and applying a potential to electrode 50 which forward-biases the emitter-base junction comprising base regions 46, 22, and 40 and emitter (cathode) region 24. Once GDS1 is on, if electrode 50 is allowed to electrically float in potential, then GDS1 can be maintained in the ON state with the potential of gate region 20 at the same or a more positive level than anode region 18 and cathode region 24, so long as the potential of gate region 20 is below the level which essentially completely depletes a vertical cross-sectional portion of semiconductor body 16 between anode region 18 and cathode region 24 and from surface 11 to the top of dielectric layer 14 and causes the potential of this cross-sectional portion to be greater than that of the anode, cathode, and regions 22, 40, 46.

As has been earlier denoted, region 20, in addition to serving as the gate terminal of the gated diode switch, serves as the collector of a lateral n-p-n transistor with regions 46 and 22 serving as the base and region 24 serving as the emitter. Region 40, which also serves as part of the base, is typically of p+ type conductivity and, thus, serves as an electrical contact to region 22. Electrode 50 contacts region 40 and thus allows the base of the n-p-n transistor to be controlled. If electrode 50 is held at a positive potential with respect to electrode 32, then the n-p-n transistor is biased on and the potential between gate region 20 (the collector of the transistor) and cathode region 24 (the emitter of the transistor is relatively small. Typically this collector-emitter voltage is on the order of several tenths to several volts. The potential of gate region 20 is thus drawn to a level close to that of the cathode region 24. This effectively reduces the gate potential to a level which is insufficient to cause the GDS to be in the OFF state with proper operating potentials applied to the anode and cathode regions. The adjusting of the potential applied to electrode 50 to forward-bias the n-p-n transistor facilitates GDS1 being relatively rapidly switched to the ON state.

Semiconductor body 16a contains essentially the same regions as semiconductor body 16, except that guard ring 40a does not have an electrical contact thereto. Thus, no external control of the base potential of the n-p-n transistor which comprises region 20a as the collector, regions 46a, 22a, and 40a as the base, and region 24a as the cathode is possible. The size of GDS1 is only slightly larger than that of GDS2. The portion of region 40 which is contacted by electrode 50 is somewhat larger than the corresponding region 40a and, accordingly, region 22 is somewhat larger than region 22a.

Figure 3:
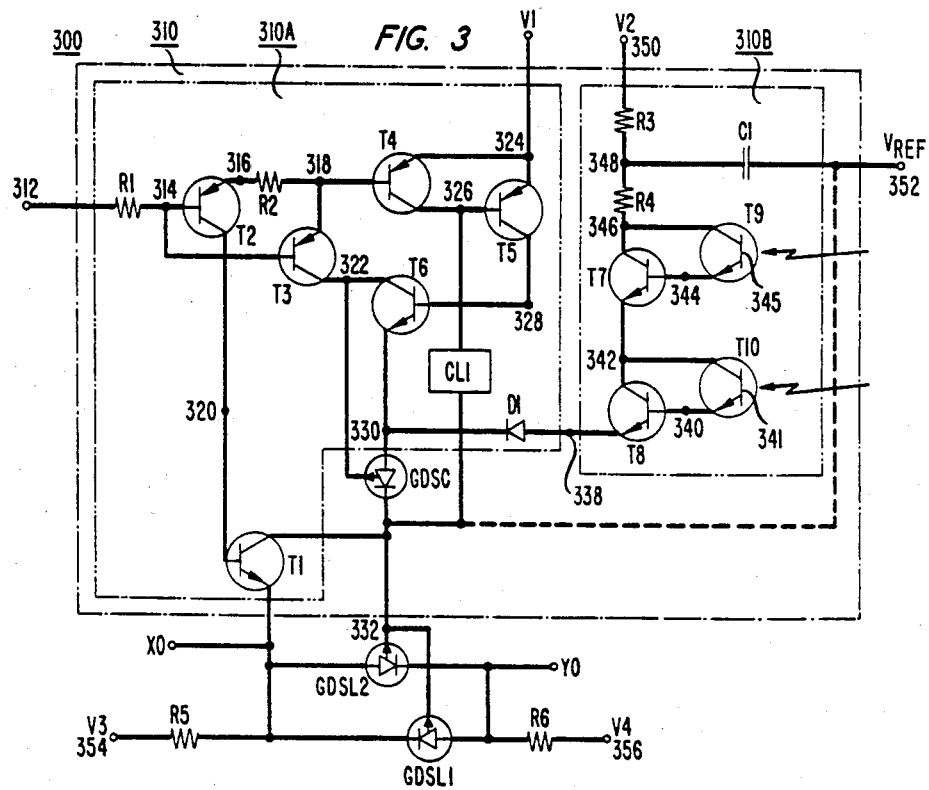
FIG. 3 illustrates control circuitry in accordance with one embodiment of the present invention.

The electrical connections shown between electrodes 28 and 32a to a terminal X, electrodes 30 and 30a to a terminal G, and electrodes 32 and 28a to terminal Y, couple GDS1 and GDS2 together so as to form a bidirectional switching element whose equivalent circuit is illustrated in FIG. 3 herein.

Figure 2:
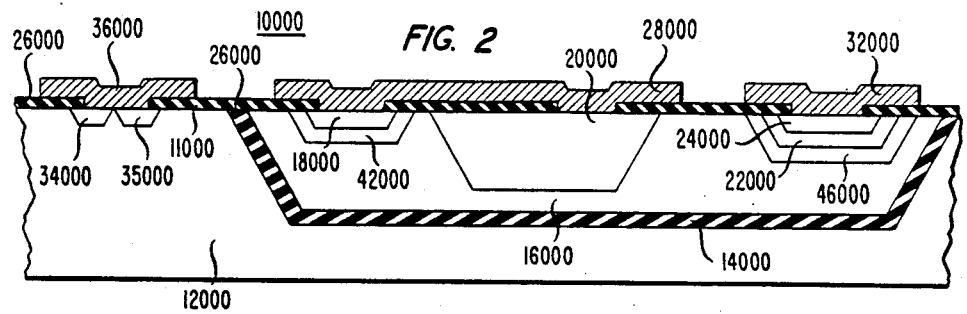
FIG. 2 illustrates a solid-state structure.

Referring now to FIG. 2, there is illustrated a structure 10,000 comprising a semiconductor support member 12,000 having a major surface 11,000 and a monocrystalline semiconductor body 16,000 whose bulk is of p type conductivity and is separated from support member 12,000 by a dielectric layer 14,000. A p+ type conductivity contact region 34,000 and an n+ type conductivity region 35,000 exist within a portion of support member 12,000 and are both coupled to an electrode 36,000 coupled thereto. Electrode 36,000 is electrically isolated from all portions of surface 11,000, except where it contacts regions 34,000 and 35,000, by a dielectric layer 26,000.

Support member 12,000 could, and usually does, include at least one other dielectrically isolated semiconductor bodies (not illustrated) like semiconductor body 16 of FIG. 1. Localized first and second separated p+ type conductivity regions 18,000 and 24,000 are included in body 16,000 with each having a portion that forms a part of surface 11,000. A localized region 42,000 of p type conductivity encircles region 18,000. A localized region 22,000 of p type conductivity encircles region 22,000 and is itself encircled by a region 46,000 which is of p− type conductivity. Semiconductor regions of relatively low resistivity are denoted as of p+ or n+ type conductivity. Those of relatively high resistivity are denoted as of p− or n− type conductivity. Those of intermediate resistivity are denoted as p or n type conductivity. A localized n+ type conductivity region 20,000 is included in body 16,000 and is located in between regions 18,000 and 24,000. An electrode 28,000 is coupled to regions 18,000 and 20,000. A separate electrode 32,000 is coupled to region 24,000. Electrodes 28,000 and 32,000 are separated from surface 11 except where they contact the respective regions by dielectric layer 26,000.

Structure 10,000 acts essentially as a pinch resistor with region 20,000 pinching off semiconductor body 16,000 to create a relatively high resistance region between the bottom of region 20,000 and the top of dielectric layer 14,000. Structure 10,000 acts to limit current flow between regions 18,000 and 24,000. Within a first range of potential difference between regions 18,000 and 24,000, the resistance between the two regions is essentially constant and the current increases linearly with voltage. Once this range is exceeded, the electrical field created under electrode 28,000 tends to effectively further pinch off the portion of semiconductor body 16,000 under region 20,000. This increases the resistance between regions 18,000 and 24,000 and thus limits current flow from one region to the other as voltage across the regions increases. Structure 10,000 thus acts as a resistor and as a current limiter.

Referring now to FIG. 3, there is illustrated a switching system 300 comprising control circuitry 310 (within the largest dashed line rectangle) which is coupled by an output terminal 332 to the gate terminals of a pair of high voltage switching devices GDSL1 and GDSL2. The anode of GDSL1 and the cathode of GDSL2 are coupled to a first terminal YO and to a resistor R6 and the cathode of GDSL1 and the anode of GDSL2 are coupled to a second terminal XO and to a resistor R5. This combination of GDSL1 and GDSL2 functions as a bidirectional switch which selectively couples terminals XO and YO via a relatively low resistance path through GDSL1 or GDSL2. For illustrative purposes, these switches will be assumed to comprise the gated diode switch structure illustrated in FIG. 1. Control circuitry 310 functions so as to supply the needed potentials at terminal 332 and the current sourcing or sinking capability necessary to control the state of GDSL1 and GDSL2.

Control circuitry 310 essentially comprises a high voltage switch GDSC, a first voltage branch circuit 310A (illustrated within a dashed line rectangle) and a second voltage branch circuit 310B (illustrated within another dashed line rectangle). Branch circuit 310A maintains the load switches GDSL1 and GDSL2 in an ON state such that conduction can occur through one or the other load switch if the potential of the anode and cathode terminals thereof is sufficient to support conduction or it can inhibit conduction through the load switches by maintaining the load switches in an OFF state. Branch circuit 310B serves to help switch GDSL1 and GDSL2 to an OFF state and therefore helps interrupt or inhibit conduction between XO and YO independent of the potentials applied thereto so long as these applied potentials are within preselected limits.

Control circuitry 310 comprises a high voltage switch GDSC, which for illustrative purposes is the switch structure GDS2 illustrated in FIG. 1, a first current limiter CL1, which for illustrative purposes is the structure illustrated in FIG. 2, n-p-n transistors T1, T6, T7, and T8, p-n-p transistors T2, T3, T4, and T5, n-p-n phototransistors T9 and T10, which each have a phototsensitive base region 341, 345, a diode D1, resistors R1, R2, R3, and R4, and a capacitor C1. A first input terminal 312 is coupled to R1, which is in turn coupled to the bases of T2 and T3 and to a terminal 314. The emitter of T2 is coupled to a terminal 316 and to R2, which is also coupled to a terminal 318, the emitter of T3 and the base of T4. The collector of T2 is coupled to the base of T1 and to a terminal 320. The collector and emitter of T1 are coupled to output terminal 332 and terminal XO, respectively. The collector of T3 is coupled to the collector of T6, the gate of GDSC, and to a terminal 322. The emitters of T4 and T5 are coupled together to a terminal 324 which is coupled to a first voltage supply (source) V1. The collector of T4 is coupled to the base of T5, one terminal of CL1, and to a terminal 326. A second terminal of CL1, in a preferred embodiment, is coupled to the cathode of GDSC and terminal 332, but it can instead be coupled to power supply (source) Vref as is indicated by the dashed line. The collector of T5 is coupled to the base of T6 and to a terminal 328. The emitter of T6 is coupled to the anode of GDSC, to the cathode of D1, and to a terminal 330. The cathode of GDSC is coupled to a second terminal of CL1 and to terminal 332. The anode of D1 is coupled to the emitter of T8 and to a terminal 338. The base of T8 is coupled to the emitter of T10 and to a terminal 340. The collectors of T8 and T10 are coupled together to the emitter of T7 and to a terminal 342. The base of T7 is coupled to a terminal 344 and to the emitter of T9. The collectors of T7 and T9 are coupled to one terminal of R4 and to a terminal 346. A second terminal of R4 is coupled to a first terminal of R3 and C1 and to a terminal 348. A second terminal of C1 is coupled to a terminal 352 which is coupled to a potential supply (source) Vref. A second terminal of R3 is coupled to a terminal 350 which is coupled to a potential supply (source) V2. The base regions of T9 and T10 are photosensitive. Terminal XO is coupled through a resistor R5 to a terminal 354 which is coupled to a potential supply (source) V3. Terminal YO is coupled through a resistor R6 to a terminal 356 which is coupled to a potential supply (source) V4.

The combination of T7 and T9 form one photo-Darlington pair and the combination of T8 and T10 form a second Darlington pair. These two Darlington pairs are connected together in series. With light incident on the photosensitive base regions 341, 345 of T9 and T10, terminals 346 and 338 are coupled together via a relatively low impedance path. With the light removed, the two terminals are electrically isolated. The series combination of two such photo-Darlington pairs is used to provide a high voltage and high current capability switch. This allows control circuitry 310 to be electrically isolated from V2 by eliminating incident light on the bases of T9 and T10. Other high voltage and high current switches can be substituted for the photo-Darlington pairs.

The basic operation is as follows: Assuming XO and YO are coupled through current limiting resistance (not illustrated) to +200 volts and −220 volts, respectively, conduction occurs through GDSL2 if the potential of gate terminal 332 is at a potential level which is near or below +220 volts. With V1=+320 volts, V2=+285 volts, Vref=0 volts, and V3=V4=−48 volts, and current limiter CL1 limiting current therethrough to 1-14 microamperes, control circuitry 310 is capable of controlling the state of GDSL1 and GDSL2 by providing the needed potentials at terminal 332 and a source of current into terminal 332.

Assuming first that it is desired to set GDSL2 to an ON (conducting) state, an input voltage signal having a level of typically +315 volts (a low or "0") is applied to input terminal 312 and light is illuminated onto the photosensitve bases of T9 and T10. The emitter-base junctions of T2, T3, and T4 become forward biased and the potential of the base of T1 (terminal 320) reaches a sufficiently positive potential with respect to the emitter (terminal XO) to forward-bias the emitter-base junction of T1 and thereby cause T1 to turn ON and pull down the potential of the collector thereof (terminal 332) to a value close to that of the potential of XO. This leaves the gate and anode of GDSL2 at close to the same potential and thus GDSL2 is in the ON state and conducts current from XO to YO. With T3 biased ON and conducting T4 is biased on since the emitter-base junction thereof is forward biased. Thus an electrical path through T4, CL1, T1 and R5 exists between V1 and V3. With T4 biased ON and conducting current through the emitter-collector thereof, the potential appearing at the base of T5 (terminal 326) is insufficient to forward-bias the emitter-base junction of T5 since the collector-emitter potential of T4 is designed to be less than the potential needed to forward-bias the emitter-base junction of T5. Thus, T5 is biased OFF and terminal 328 is electrically isolated from V1. Because the base terminal 328 of T6 is electrically floating, T6 is biased off. Terminals 328 and 330 are now electrically isolated from V1. The gate (terminal 322) of GDSC is at a potential near V1 since T3 is biased on. The anode terminal 330 is at a potential between approximately V1 and V2. While the anode terminal 330 is near V1 in potential, GDSC is ON and conducts until the potential of anode terminal 330 drops to approximately 20 volts below the potential of gate terminal 322. GDSC then switches OFF and conduction therethrough ceases. In addition, terminal 332 is also isolated from V2 since GDSC is OFF.

It is thus clear that branch circuit 310A serves to maintain load switch GDSL2 in the ON state and thus allows conduction therethrough.

Assume that it is now desired to switch GDSL2 to the OFF (blocking) state. Input terminal 312 is set to the level of +320 volts (a high level or "1"). This turns off T2, T3, and T4. T5 now becomes biased on and is typically operated in saturation such that terminal 328 rises in potential and forward-biases the emitter-base junction of T6. This brings the voltage of 330 near V1 and thus switches GDSC to the ON state. This causes terminal 332 to rise in potential to a level close to V1. This potential on terminal 332 is sufficient to switch GDSL2 to the OFF (blocking) state if there is sufficient positive current flow into the gate of GDSL2. Minority carriers (e.g., electrons) emitted at the cathode of GDSL2 and collected at the gate (terminal 332) constitute the equivalent of positive current flow from V1 through T5, the emitter-base junction of T6, GDSC, and into the gate of GDSL2. This current flow can be substantial and as a result it is necessary to have a high voltage and current device such as GDSC to switch GDSL2 to the OFF state. A high voltage and high current transistor would be expensive.

T5 is typically designed to have a relatively low current handling capability. As the current flow through T5 begins to increase, the voltage drop across the collector-emitter of T5 increases significantly until the potential of terminal 328 decreases to a level near V2.

T5 then essentially limits further conduction therethrough. D1, which had previously been reverse-biased, now becomes forward-biased. With light incident on the photosensitive bases 345 and 341 of T9 and T10, respectively, positive current flows from C1 and V2 into terminal 330 and through GDSC and into the gate of GDSL2. The potential of terminal 330 drops to a level below but close to that of V2. The values of R3, R4, C1, and the potential of V2 are selected to provide substantially more current than can be provided by T5. Accordingly, GDSL2 is switched to the OFF state.

It is thus clear that 310A serves to essentially maintain GDSL2 in the OFF state and 310B serves to switch GDSL2 to the OFF state and to therefore help interrupt or inhibit conduction between XO and YO independent of the potentials applied to XO and YO so long as these applied potentials are within preselected limits.

If GDSL2 fails to switch OFF C1 becomes essentially discharged. Then the light incident on T9 and T10 is removed allowing C1 to recharge and terminal 312 is returned to +315 volts. This resets GDSC to the OFF state and allows GDSL2 to continue to be in the ON state and conducting. Light is again illuminated on the photosensitive bases of T9 and T10 and then the potential of 312 is raised back to +320 volts. GDSC is again switched to the ON state and another attempt is made at causing GDSL2 to be switched from the ON to the OFF state.

In one embodiment R1, R2, R3, R4, R5, and R6 are typically 1000, $10^5$, $10^4$, 500, $10^6$, and $10^6$ ohms, respectively, and C1 is 0.1 microfarads.

The combination of T7, T9, T8, and T10, which act as essentially a single high voltage and high current switch, are relatively expensive components. R3, R4, C1, T7, T9, T8, and T10 can be shared between a number of control circuitries 310.

If YO is more positive in potential than XO, then GDSL2 does not conduct and GDSL1 is affected in essentially the same manner as is described above for the operation of GDSL2.

Figure 4:
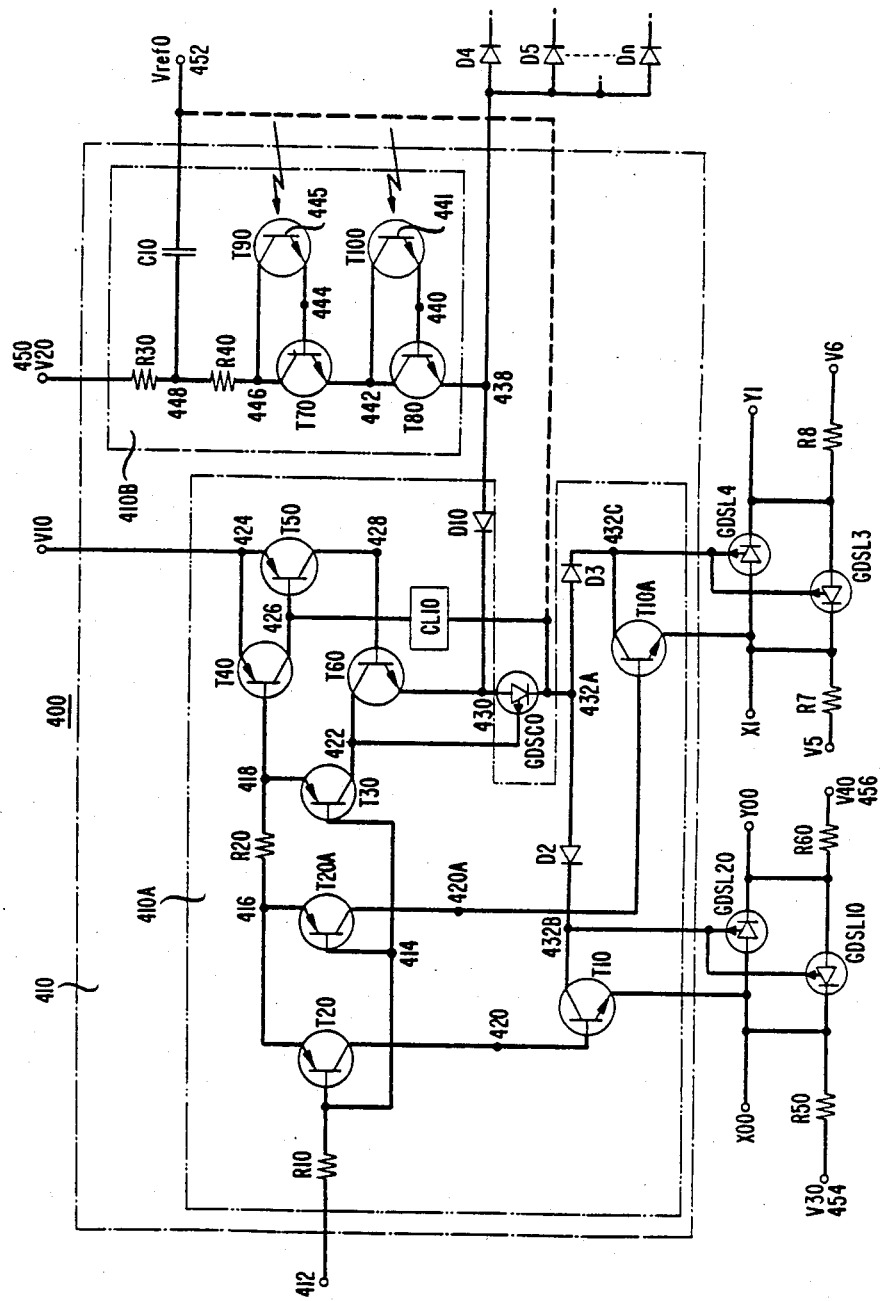
FIG. 4 illustrates control circuitry in accordance with another embodiment of the present invention.

Referring now to FIG. 4, there is illustrated a switching system 400 comprising control circuitry 410 (contained in the large dashed line rectangle), two pairs of bidirectional switches GDSL10, GDSL20, and GDSL3, GDSL4, and resistors R50, R60, R7, and R8.

Control circuitry 410 essentially comprises a first voltage branch 410A (illustrated within another dashed line rectangle) and a second voltage branch circuit 410B (illustrated within still another dashed line rectangle). The components of 410B are essentially the same as the components of 310B of FIG. 3, and they function in essentially the same way. The components of 410A are essentially the same as those of 310A of FIG. 1, except that four additional devices, n-p-n transistor T10A, p-n-p transistor T20A, and diodes D2 and D3 have been added to facilitate the controlling of a second bidirectional switch which comprises gated diode switches GDSL3 and GDSL4. An output terminal 438 of 410B is illustrated connected to the anodes of diodes D4, D5 . . . Dn. Each of these diodes represents a branch circuit which is essentially identical to 410A, and which has a separate pair of bidirectional switches, like GDSL10, GDSL20, and GDSL3 and GDSL4 coupled thereto. The control voltage branch 410B of control circuitry 400 is thus shared by n other control circuits which are essentially identical to 400.

D2 and D3 serve to electrically isolate terminals X00 and Y00 from X1 and Y1. T20A serves to control T10A in the same manner that T20 controls T10. Components of 400 which are essentially identical to components of control circuitry 310 of FIG. 3 have the same reference denotation with a "0" added thereto. Corresponding terminals have a "4" as the first reference number whereas in FIG. 3 the first reference number is a "3".

Control circuitry 400 has been built and found to be functional. Four voltage branch circuits 410A and one shared branch circuit 410B were used to control the states of eight pairs of gated diode switches. Each of the pairs of gated diode switches were similar to structure 10 of FIG. 1 except that there was no electrode coupled to region 40. Transistors T10 and T10A, and the corresponding six other transistors (not illustrated), were separate transistors. All of the circuitry of the first voltage branches 410A and the eight pairs of gated diode switches were fabricated on a single integrated circuit chip having an area of 14 square millimeters using dielectric isolation of components. The structure of the junction transistors used were similar to those disclosed in copending U.S. patent application, Ser. No. 971,632, now Pat. No. 4,232,328, which was filed on Dec. 20, 1978, and in which there is a common assignee with the present application. The average turn-on time of a gated diode switch used with 400 is 300 microseconds. The turn-off time is 50 microseconds. The average power dissipation of each of the branch circuits 410A is 5 milliwatts.

The embodiments described herein are intended to be illustrative of the general principles of the present invention. Various modifications are possible consistent with the spirit of the invention. For example, transistor T6 of FIG. 3 and T60 of FIG. 4 can be eliminated. In such cases, the collector of T5 of FIG. 3 is connected directly to the anode of GDSC and the collector of T50 of FIG. 4 is connected directly to the anode of GDSCO. Still further, other high voltage and high current switches, such as a gated diode switch, could be substituted for the photo-Darlington pairs provided appropriate control circuitry is provided to control same. Still further, the junction transistors could be replaced by field effect transistors provided the polarities and magnitudes of the power supplies and circuit configurations are appropriately modified as is well known in the art. Still further, R1, R2, R3, R4, R5, and R6 can be standard integrated circuit resistors or pinch resistors. Still further, the current limiter can be a variety of different types of resistors or a junction field effect transistor. Still further, the configurations of T3, T4, and T5 of FIG. 3 and T30, T40, and T50 of FIG. 4 could be replaced by the circuitry illustrated within the dashed line rectangles A and A0 of FIGS. 1 and 2 of copending U.S. patent application, Ser. No. 972,024 now Pat. No. 4,269,048 filed on Dec. 20, 1978, which has a common assignee with the present application. Still further, if at least one of the load GDSs of each pair is like GDS1 of FIG. 1, then the transistor which selectively causes the gate and cathode (anode) to be close to each other in potential, transistor T1 (T10A, T10 ... ), is part of the GDS and terminal 320 (420, 420a ... ) is connected directly to electrode 50 (or its equivalent) of the load GDS. Still further, CL1 and CL10 can be connected to V2 and V20, respectively, instead of being connected to the cathodes of the respective GDSCs. Still further, D2 and D3 can be eliminated if a second control gated diode switch, like GDSCO, is added with its anode common to the anode of GDSC and its gate common to the gate of GDSC, and it cathode connected directly to the gates of GDSL3 and GDSL4. In this case the cathode of GDSCO is connected directly to the gates of GDSL10 and GDSL20. Still further, T5 and T50 can be designed to have relatively high current capabilities. The load switches GDSLs can be switched to the OFF state solely by the first branch circuits 310A and 410A so long as the current flow through the load switches GDSLs is within preselected limits. If this current flow is greater than these limits then the second branch circuits 310B and 410B are necessary to switch the load switches GDSLs to the OFF state.

We claim:

1. In combination:
    a first switching device and a second switching device, each said device comprising a semiconductor body having a bulk portion which is of relatively high resistivity and of a first conductivity type, a first region of the first conductivity type and of relatively low resistivity, and second and third regions of a second conductivity type opposite that of the first conductivity type and of relatively low resistivity, the first and third regions being connected to separate output terminals of the switching device, the second region being coupled to a control terminal of the switching device, and the first, second, and third regions being mutually separated by portions of the bulk of the semiconductor body;
    said second switching device having essentially same electrical characteristics as the first switching device, said second switching device being coupled to the first switching device and being used to provide control of the first switching device;
    means coupled to the second switching device for aiding in selectively switching off the first switching device, said means comprising first and second branch circuits;
    the first branch circuit being adapted to selectively allow up to a preselected current level to flow therethrough and to flow into or out of the control terminal of the first switching device;
    the second branch circuit being adapted to substantially inhibit current flow therethrough if the level of current flow through the first branch circuit is less than the preselected current level; and
    the second branch circuit being further adapted to allow a greater current level than the preselected level to flow therethrough and to flow into or out of the control terminal of the first switching device if, and only if, the current flowing through the first branch circuit reaches the preselected level.

2. In combination:
    a first switching device and a second switching device, each said device comprising a semiconductor body having a bulk portion which is of relatively high resistivity and of a first conductivity type, a first region of the first conductivity type and of relatively low resistivity, and second and third regions of a second conductivity type opposite that of the first conductivity type and of relatively low resistivity, the first and third regions being connected to separate output terminals of the switching device, the second region being coupled to a control terminal of the switching device, the first, second, and third regions being mutually separated by portions of the bulk of the semiconductor body;
    said second switching device having essentially same electrial characteristics as the first switching device, said second switching device being coupled by a second output terminal thereof to the control terminal of the first switching device for controlling the first device;

means, under the effective control of applied signals, coupled to a first output terminal of the second switching device for aiding in selectively switching off the first switching device, said means comprising first and second branch circuits which are each coupled to the first output terminal of the second switching device;

the first branch circuit being adapted to selectively allow up to a preselected current level to flow therethrough which flows through the second switching device and flows into or out of the first switching device;

the second branch circuit being adapted to substantially inhibit current flow therethrough if the level of current flow through the first branch circuit is less than the preselected level;

the second branch circuit being further adapted to allow a greater current level than the preselected level to flow therethrough which flows through the second switching device and flows into or out of the first switching device if, and only if, the current level flowing through the first branch circuit reaches the preselected level; and the first and second branch circuits being adapted such that the current flowing through each does not flow through the other.

3. In combination:

a first gated diode switch and a second gated diode switch, each said switch comprising a semiconductor body having a bulk portion which is of relatively high resistivity and of a first conductivity type, a first region of the first conductivity type and of relatively low resistivity, and second and third regions of a second conductivity type opposite that of the first conductivity type and of relatively low resistivity, the first and third regions being connected to separate output terminals of the switching device, the second region being coupled to a control terminal of the switching device, and the first, second, and third regions being mutually separated by portions of the bulk of the semiconductor body;

the second gated diode switch having essentially same electrical characteristics as the first gated diode switch, said second gated diode switch being coupled by a second output terminal thereof to the control terminal of the first gated diode switch so as to control the first switch;

first means, under the effective control of applied signals, coupled to the second gated diode switch for controlling the second gated diode switch;

second means, under the effective control of applied signals, coupled to a first output terminal of the second gated diode switch for aiding in selectively switching off the first gated diode switch, said second means comprising first and second branch circuits which are each coupled to the first output terminal of the second gated diode switch;

the first branch circuit being adapted to selectively allow up to a preselected current level to flow therethrough which flows through the second gated diode switch and flows into or out of the control terminal of the first gated diode switch;

the second branch circuit being adapted to substantially inhibit current flow therethrough if the level of current flow through the first branch circuit is less than the preselected level;

the second branch circuit being further adapted to allow a greater current level than the preselected level to flow therethrough which flows through the second gated diode switch and then flows into or out of the control terminal of the first gated diode switch if, and only if, the current level flowing through the first branch circuit reaches the preselected level; and the first and second branch circuits being adapted such that the current flowing through each does not flow through the other.

4. The combination of claim 3 wherein:

the first means and the first branch circuit comprise third (T3), fourth (T4), fifth (T5) and sixth (T6) switching devices, and a current limiter;

the third, fourth, and fifth switching devices each being a separate p-n-p type junction transistor and the sixth switching device being an n-p-n type junction transistor, each of the transistors having a base, a collector, and an emitter;

the base terminal of T3 being coupled to an input combination terminal;

the collector of T3 being coupled to the collector of T6 and to the control terminal of the second gated diode switch;

the emitter of T3 being coupled to the base of T4;

the emitters of T4 and T5 being coupled together and being adapted to be coupled to a first potential source;

the collector of T4 being coupled to the base of T5 and to a first terminal of the current limiter;

a second terminal of the current limiter being coupled to the second output terminal of the second gated diode switch;

the collector of T5 being coupled to the base of T6; and the emitter of T6 being coupled to the first output terminal of the second gated diode switch;

5. The combination of claim 4 wherein:

the second branch circuit comprises first and second resistors, a capacitor, and an n-p-n junction photo-transistor;

a first terminal of the first resistor being adapted to be coupled to a second potential source;

a second terminal of the first resistor being coupled to a first terminal of the capacitor and to a first terminal of the second resistor;

a second terminal of the second resistor being coupled to a collector of the photo-transistor; and an emitter of the photo-transistor being coupled to the first output terminal of the second gated diode switch.

6. The combination of claim 5 further comprising:

seventh (T2) and eight (T1) switching devices;

T2 being a p-n-p junction transistor and T1 being an n-p-n junction transistor, each of T1 and T2 having a base, emitter and collector;

the base of T2 being coupled to the input combination terminal;

the emitter of T2 being coupled to the emitter of T3;

the collector of T2 being coupled to the base of T1; and the collector and emitter of T1 being coupled to the control terminal and one of the output terminals, respectively, of the first gated diode switch.

7. The combination of claim 6 wherein the first and second output terminals and the control terminal are the anode, cathode, and gate terminals, respectively, of each gated diode switch.

* * * * *